(12) United States Patent
Cheng

(10) Patent No.: US 12,426,277 B2
(45) Date of Patent: Sep. 23, 2025

(54) EMBEDDED DOUBLE SIDE HEATING PHASE CHANGE RANDOM ACCESS MEMORY (PCRAM) DEVICE AND METHOD OF MAKING SAME

(71) Applicant: Taiwan Semiconductor Manufacturing Company, Hsinchu (TW)

(72) Inventor: Chung-Liang Cheng, Changhua (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 656 days.

(21) Appl. No.: 17/581,252

(22) Filed: Jan. 21, 2022

(65) Prior Publication Data
US 2023/0029141 A1  Jan. 26, 2023

Related U.S. Application Data

(60) Provisional application No. 63/225,016, filed on Jul. 23, 2021.

(51) Int. Cl.
*H10B 63/00* (2023.01)
*H10D 30/67* (2025.01)
(Continued)

(52) U.S. Cl.
CPC ......... *H10B 63/30* (2023.02); *H10D 30/6735* (2025.01); *H10D 30/6755* (2025.01); *H10D 30/6757* (2025.01); *H10D 62/118* (2025.01); *H10D 64/62* (2025.01); *H10D 99/00* (2025.01); *H10N 70/011* (2023.02); *H10N 70/231* (2023.02); *H10N 70/8828* (2023.02)

(58) Field of Classification Search
USPC ........................................... 438/10
See application file for complete search history.

(56) References Cited

U.S. PATENT DOCUMENTS

| | | | |
|---|---|---|---|
| 2012/0063198 A1* | 3/2012 | Liu | G11C 11/5678 365/182 |
| 2014/0106549 A1* | 4/2014 | Zheng | C23C 16/305 118/724 |

(Continued)

FOREIGN PATENT DOCUMENTS

| | | |
|---|---|---|
| TW | 200835008 A | 8/2008 |
| TW | 200919716 A | 5/2009 |

(Continued)

*Primary Examiner* — Eva Y Montalvo
*Assistant Examiner* — Jiyoung Oh
(74) *Attorney, Agent, or Firm* — Lippes Mathias LLP

(57) ABSTRACT

In fabrication of a phase change random access memory (PCRAM), a field effect transistor (FET) logic layer is formed on a first wafer, including a heating FET for each storage cell. The FET logic layer is transferred from the first wafer to a carrier wafer. Thereafter, a storage layer of the PCRAM is formed on the exposed surface of the FET logic layer, including a region of a phase change material for each storage cell that is electrically connected to a channel of the heating FET of the storage cell. The storage layer further includes a second heating transistor for each storage cell that is electrically connected to a channel of the second heating transistor.

20 Claims, 24 Drawing Sheets

(51) Int. Cl.
    *H10D 62/10*     (2025.01)
    *H10D 64/62*     (2025.01)
    *H10D 99/00*     (2025.01)
    *H10N 70/00*     (2023.01)
    *H10N 70/20*     (2023.01)

(56) References Cited

U.S. PATENT DOCUMENTS

| | | | |
|---|---|---|---|
| 2014/0239244 A1 | 8/2014 | Pellizzer et al. | |
| 2017/0358744 A1 | 12/2017 | Tan et al. | |
| 2018/0351087 A1 | 12/2018 | Choi | |
| 2019/0123103 A1* | 4/2019 | Wu | H10N 70/8413 |
| 2020/0243487 A1* | 7/2020 | Or-Bach | H01L 24/80 |
| 2021/0066458 A1* | 3/2021 | Tak | H01L 29/78696 |
| 2021/0225441 A1 | 7/2021 | Gong et al. | |

FOREIGN PATENT DOCUMENTS

| | | |
|---|---|---|
| TW | 201114081 A | 4/2011 |
| TW | 201903967 A | 1/2019 |
| TW | 201917828 A | 5/2019 |
| TW | 202025447 A | 7/2020 |

* cited by examiner

EMBEDDED DOUBLE SIDE HEATING PHASE CHANGE RANDOM ACCESS MEMORY (PCRAM) DEVICE AND METHOD OF MAKING SAME

This application claims the benefit of U.S. provisional application Ser. No. 63/225,016 filed Jul. 23, 2021 and titled "EMBEDDED DOUBLE SIDE HEATING PHASE CHANGE RANDOM ACCESS MEMORY (PCRAM) DEVICE AND METHOD OF MAKING SAME". U.S. provisional application Ser. No. 63/225,016 filed Jul. 23, 2021 and titled "EMBEDDED DOUBLE SIDE HEATING PHASE CHANGE RANDOM ACCESS MEMORY (PCRAM) DEVICE AND METHOD OF MAKING SAME" is incorporated herein by reference in its entirety.

BACKGROUND

The following relates to electronic memory arts, phase change random access memory (PCRAM) arts, PCRAM fabrication arts, and to related arts.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
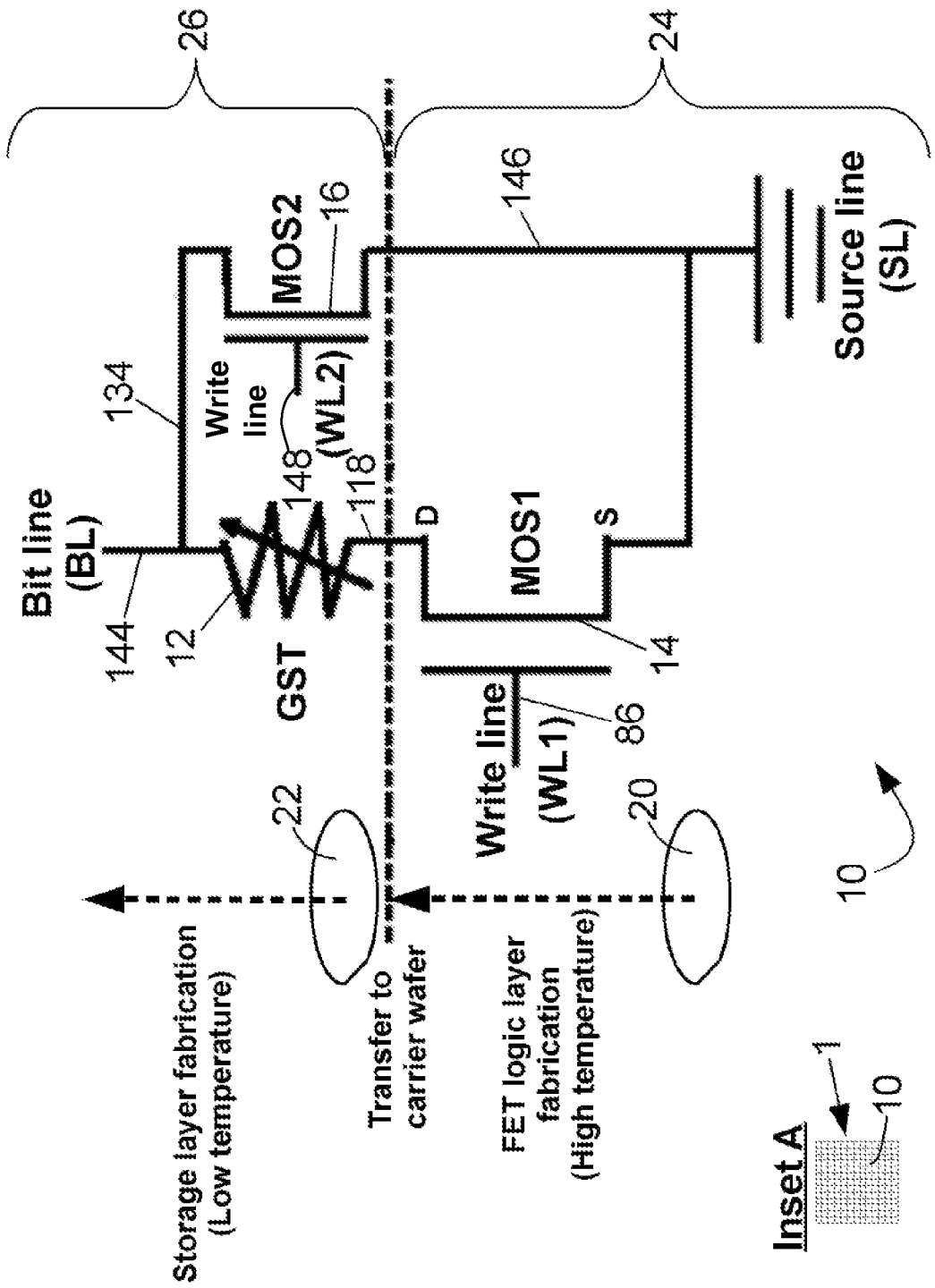
FIG. 1 diagrammatically illustrates a storage cell of a vertical architecture phase change random access memory (PCRAM), in which the storage cell includes a second heating FET, shown by way of diagrammatic equivalent circuit.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various semiconductor technology areas benefit from random access memory (RAM) with a high areal density of storage cells. However, using dimension reduction to increase transistor density in memories such as flash and DRAM memory is challenging due to physical limitations.

An integrated logic and passive device structure is another approach for increasing RAM memory areal storage cell density. Phase change random access memory (PCRAM) leverages a phase change material such as a chalcogenide material as a passive information storage element. By flowing electric current through the phase change material, its phase can be switched between a crystalline phase with low electrical resistance, and a vitreous (or amorphous) phase with high electrical resistance. A large electric current that is large enough to induce a phase change is used to write to a PCRAM storage cell, while a lower electric current that is too low to induce a phase change is used to detect the resistivity of the phase change material and thus read the PCRAM storage cell. For writing, in a typical approach a short high-amplitude electrical pulse causes rapid heat and quench to produce the amorphous state; whereas a longer electrical pulse of lower (but still high) amplitude is used to place the material into the crystalline state.

Typically, a PCRAM architecture includes an integrated circuit (IC) in which each PCRAM storage cell includes a region of phase change material and a driving a field effect transistor (FET). This approach can limit the areal packing density of storage cells. Device speed can also be limited by the current density that can be applied to the region of phase change material by the FET. The low current density could be addressed by adding a second FET to each storage cell; however, this would increase the area of each storage cell and thus adversely impact areal cell density of the PCRAM.

Fabrication of a PCRAM can also be challenging. The FET fabrication typically entails high temperature process operations, while formation of the region of phase change material (e.g. a region of chalcogenide material) is usually performed at lower temperature.

Disclosed herein is an embedded double side heating PCRAM device and method to perform stacked device structure for increasing device density. In one illustrative fabrication embodiment, the method includes: using silicon on insulator (SOI) (or SiGe/Si epitaxy) as a substrate for a FET logic fabrication process such as a finFET or gate all around (GAA) MOSFET process and front end-of-line (FEOL) and mid-end-of-line (MEOL) processing; bonding with a carrier wafer and flipping the assembly for backside silicon (Si) thinning with the thinning stopping on the SOI oxide or insulator (or SiGe) layer; performing backside contact patterning and contact silicide/plug formation; and using the flipped wafer as substrate for embedded backside phase change random access memory (PCRAM) formation and an optional backside heating transistor to improve heating efficiency.

Compared with designs in which the FET logic and the passive device (e.g. chalcogenide phase change material) are on the same plane (side by side), some embodiments disclosed herein include an embedded backside PCRAM and backside heating transistor to advantageously increase areal storage cell density.

With reference to FIG. 1, a storage cell 10 of a vertical architecture PCRAM is shown by way of diagrammatic equivalent circuit. The illustrative PCRAM storage cell 10 includes a region of phase change material 12, which in the illustrative embodiment is a germanium antimony telluride (GST) material such as for example $Ge_2Sb_2Te_5$. More generally, another phase change material could be used, such as a chalcogenide material, two examples of which include the illustrative GST material or a titanium antimony telluride (TST) composition. As diagrammatically indicated in FIG. 1, the region of phase change material 12 operates as a variable resistor, which has a high resistance when the GST is in the amorphous or vitreous state, and a low resistance when the GST is in the crystalline state. (More generally, enough of the region 12 suitably switches to an extent sufficient to switch the electrical resistance of the region 12 to define two different storage states).

The storage cell 10 further includes a heating field effect transistor (FET) 14 also designated as "MOS1" in FIG. 1, indicating the illustrative heating FET 14 is a metal-oxide-semiconductor (MOS) FET. The region of phase change material 12 is electrically connected to be heated by a channel electric current flowing between the source and drain (designated in FIG. 1 as "S" and "D" respectively) of the at least one heating FET 14 of the storage cell. The gate of the heating FET 14 is connected with a write line (WL1) of the storage cell 10 for writing to the storage cell 10 (that is, for switching the electrical state of the storage cell 10 between one logic state in which the GST 12 is in the high resistance state and another logic state in which the GST 12 is in the low resistance state).

The illustrative storage cell 10 further includes a second heating transistor 16 that is also electrically connected to heat the phase change material 12 of the storage cell 10 by a channel current of the second heating transistor 16. The second heating transistor 16 is also designated as "MOS2" in FIG. 1. However, in general the first heating FET 14 and the second heating transistor 16 have different construction and/or be made of different materials, as described later herein.

As further diagrammatically indicated in FIG. 1, and with particular reference to Inset A of FIG. 1, it is to be understood that the PCRAM storage cell 10 is one storage cell of a PCRAM 1 that includes a two-dimensional array of such storage cells 10, as diagrammatically shown by Inset A. With returning reference to the main drawing of FIG. 1 showing the circuit diagram representation of one storage cell 10, the storage cell 10 (and of the PCRAM 1 as a whole) has a vertical architecture. The fabrication of the PCRAM 1 is diagrammatically shown at a high level at the left side of the main drawing of FIG. 1, and utilizes a first wafer 20 and a second wafer 22, which will also be referred to herein as a carrier wafer 22. A FET logic layer 24 is formed on the first wafer 20, which includes at least one heating FET 14 for each storage cell 10 of the PCRAM 1. This is followed by transfer of the FET logic layer 24 from the first wafer 20 to the second (carrier) wafer 22. After the transfer, a storage layer 26 which includes the region of a phase change material 12 and the second heating transistor 16 is formed on the FET logic layer 24. Additional metallization steps provide the appropriate electrical interconnects to form the final PCRAM 1 including an array of storage cells 10.

This vertical architecture has numerous advantages. The vertical architecture of the resulting PCRAM 1 enables a higher areal density of storage cells 10 on the final wafer (namely the carrier wafer 22, which is the wafer to which the final PCRAM 1 is bonded). This is because the storage region 26 with the regions of phase change material 12 of the storage cells 10 is vertically separated from the underlying FET logic layer 24, enabling each individual layer 24, 26 to be more tightly packed (i.e., greater areal packing density is achievable) compared with designs in which the logic FETs are laterally interspersed between regions of phase change material.

Another advantage is that the separation of the fabrication process into fabrication of the FET logic layer 24 followed by the storage layer 26 enables the formation of each layer to employ optimal processing temperature for that layer. Notably, fabrication of FET logic circuitry commonly employs relatively high temperatures, e.g. commonly at least one process operation at a temperature of at least 700° C., and often FET fabrication operations are performed at temperatures of 800-900° C. or higher. By contrast, a region of a phase change material such as a chalcogenide material is commonly done at a temperature of 500° C. or less. For example, GST is sometimes formed at around 400° C. Hence, the processing on the first wafer 20 can be done at high temperature (e.g. 700° C. or higher in some illustrative embodiments), followed by the transfer to the second wafer 22 after which the formation of the storage layer 26 can be done at a lower temperature, e.g. 500° C. or less in some embodiments. By the disclosed vertical fabrication approach, the high temperature fabrication of the FET logic circuitry 24 is completed before the low temperature fabrication of the storage layer 26, thus advantageously ensuring that the storage layer 26 is not exposed to the higher temperatures used in fabrication of the FET logic circuitry 24.

Furthermore, the lower temperature typically used in formation of the storage layer 26 facilitates the transfer of the FET logic layer 24 from the first wafer 20 to the second (carrier) wafer 22. This is because the lower temperature processing performed subsequent to the transfer avoids damaging the bond between the carrier wafer 22 and the FET logic layer 24. For example, in some illustrative embodiments this bond is formed by way of fusion bonding between highly planar oxide layers formed on the bonded surfaces of the carrier wafer 22 and the FET logic layer 24. Such a fusion bonding process may be unstable at the higher temperatures of the FET fabrication processing, but is likely to be stable at the lower temperatures used in fabrication of the storage layer 26.

In the illustrative example of FIG. 1, the storage layer 26 also includes the second heating transistor 16 for each storage cell 10. This enables higher electrical current for switching the state of the region of phase change material 12. However, by placing the second heating transistor 16 in the storage layer 26, it does not occupy space in the FET logic layer 24, thus enabling closer areal packing of storage cells 10 while still providing the enhanced switching current.

To facilitate low temperature processing of the storage layer 26, the second heating transistor 16 may be of a different type and/or made of a different material than the heating FET 14 of the FET logic layer 24. For example, in some nonlimiting illustrative embodiments the heating FET 14 is a GAA FET employing a silicon channel, whereas the second heating transistor 16 has a channel comprising an indium gallium zinc oxide (InGaZnO) composition doped $n^+$-type for electrical conductivity. The InGaZnO channel of the second heating transistor 16 can be formed at a lower temperature than the silicon gate of the heating FET 14, e.g. in some embodiments the second heating transistor 16 can be formed at 500° C. or lower, and at around 400° C. in some illustrative embodiments. This enables integration of the second heating transistor 16 into the storage layer 26 providing the areal packing density advantage mentioned above.

The additional reference numbers 86, 118, 134, 144, 146 shown in FIG. 1 are described later herein in reference to illustrative cross-sectional views of nonlimiting illustrative embodiments.

Figure 2:
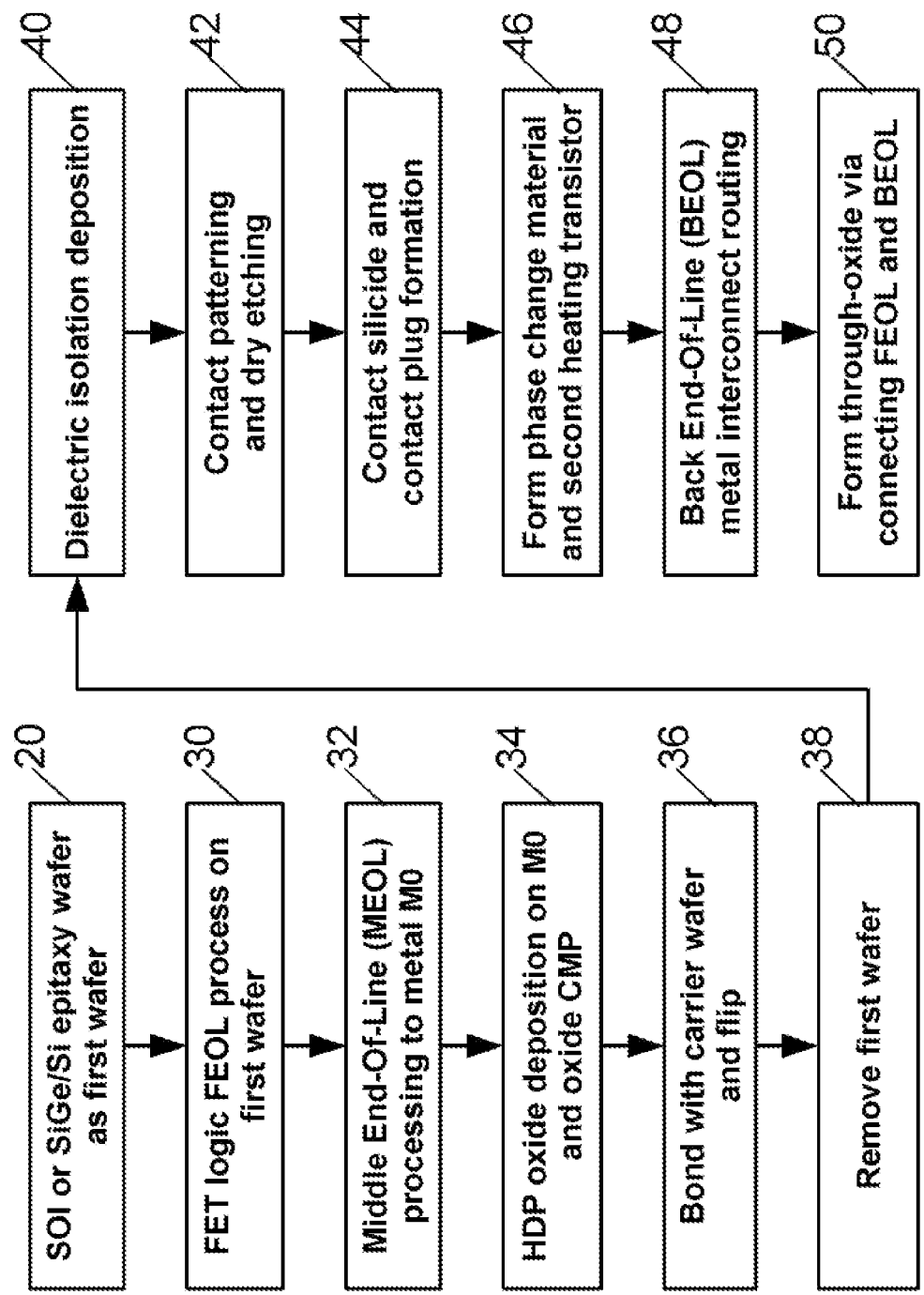
FIG. 2 diagrammatically illustrates a method of manufacturing a vertical architecture PCRAM including a second heating FET.

With reference now to FIG. 2, an illustrative method of fabricating a PCRAM 1 with a vertical architecture as diagrammatically shown in FIG. 1 is described by way of a flowchart. FIGS. 3-22 diagrammatically illustrate by way of diagrammatic cross-sectional view successive steps of various embodiments and aspects of the method of FIG. 2; however, FIG. 2 is first described here to provide an overview of the method. The process starts with the first wafer 20, where block 20 in FIG. 2 diagrammatically represents the first wafer 20 previously shown in FIG. 1. The first wafer 20 includes an etch stop layer that will be used during removal of the first wafer 20 during a later step 38 of the process. If the first wafer 20 is a commercially available silicon-on-insulator (SOI) wafer, then the insulator of the SOI wafer may serve as the etch stop. Alternatively, the first wafer 20 may comprise a silicon wafer on which is deposited an etch stop layer followed by epitaxial silicon (see diagrammatic cross sectional views of FIGS. 3-5). In operations 30, 32 the FET logic layer 24 is formed on the first wafer 20. More particularly, front end-of-line (FEOL) processing 30 is performed on the first wafer 20 to form the heating FETs 14 of the storage cells 10 of the PCRAM 1. Middle end-of-line (MEOL) processing 32 is then performed up to metal M0 (i.e., the first metal layer making contact to the heating FETs 14 of the storage cells 10 of the PCRAM 1).

Next, the FET logic layer 24 is transferred from the first wafer 20 to the second (carrier) wafer 22. The carrier wafer 22 may be a silicon wafer, or more generally may be any type of wafer that provides suitable structural support for the fabricated PCRAM 1. To this end, in an operation 34 a high density plasma (HDP) oxide deposition is performed on metal M0 of the FET logic layer 24, and the HDP oxide is planarized using chemical mechanical polishing (CMP). A similar oxide is formed on the carrier wafer 22 (operation not shown). Thereafter, in an operation 36, the FET logic layer 24 (and more particularly the planarized HDP oxide deposited thereon) is bonded to the carrier wafer 22 (and more particularly the planarized HDP oxide deposited thereon) using a suitable bonding process such as fusion bonding. Finally, in an operation 38 the first wafer 20 is removed from the FET logic layer 24, thus completing its transfer to the carrier wafer 22. The removal operation 38 can entail one or more of chemical etching, mechanical grinding, chemical-mechanical etching, and/or so forth.

The fabrication of the storage layer 26 is performed next. In an operation 40, a dielectric isolation deposition is performed, followed by an operation 42 of contact patterning and dry etching to open a via passage to the drain of the heating FET 14. In an operation 44, a silicide layer is formed on the drain of the heating FET 14 and a contact plug is formed contacting the silicide layer. In an operation 46 the region of phase change material 12 is formed on the plug, and the second heating transistor 16 is also formed. In an operation 48, back end-of-line (BEOL) processing is performed to form metal interconnect routing for the storage cell 10, and in an operation 50 a through-oxide via is formed to connect the gate of the heating FET 14 to the write line (WL1) of the storage cell 10.

Figure 3:
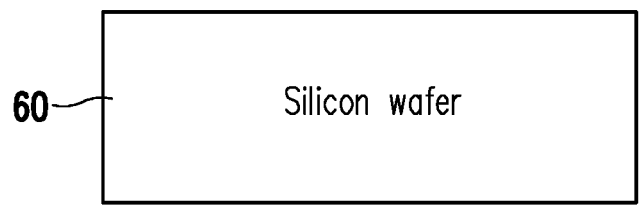
FIGS. 3-5 diagrammatically illustrate a method of manufacturing a first wafer used in fabricating a PCRAM.
Figure 4:
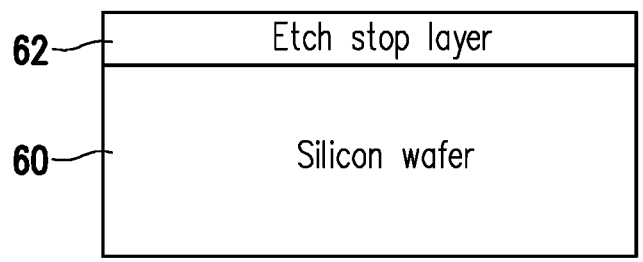
Figure 5:
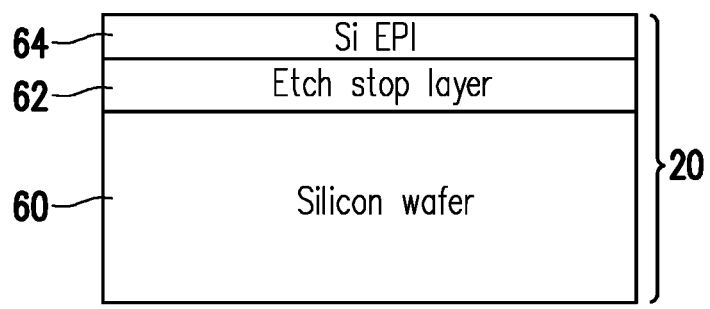

With reference now to FIGS. 3-5, an illustrative approach for fabricating the first wafer 20 is described by way of diagrammatic cross-sectional views showing successive steps of the process. Starting with a silicon wafer 60, as shown in FIG. 3, an etch stop layer 62 is formed on the silicon wafer 60 as shown in FIG. 4. The etch stop layer 62 will be used as an etch stop in the removal of the first wafer 20 after bonding of the FET logic layer 24 to the carrier wafer 22. After forming the etch stop layer 62, epitaxial silicon 64 is deposited on the etch stop layer 62 to form the starting silicon surface for formation of the FET logic layer 24. The etch stop layer 62 can comprise any material that is both sufficiently chemically distinct from silicon to serve as an etch stop, and also capable of serving as a surface supporting the subsequent epitaxial growth of silicon as depicted in FIG. 5.

In some nonlimiting illustrative embodiments, the etch stop layer comprises a silicon germanium (SiGe) layer with around 20-30% silicon (that is, a $Si_{1-x}Ge_x$ layer where x is around 20-30%). Because SiGe has a larger lattice constant than silicon, in some embodiments the SiGe layer is doped with boron to produce lattice contraction to reduce the lattice mismatch between the SiGe and Si.

In other nonlimiting illustrative embodiments, the etch stop layer 62 is an oxide layer, so that the resulting first wafer 20 is a silicon-on-insulator (SOI) wafer. In some embodiments, the first wafer 20 may be a commercially available SOI wafer in which the etch stop layer 62 is a buried silicon dioxide layer. Such commercial SOI wafers may be formed by techniques such as bonding/etchback, separation by implantation of oxygen (SIMOX), or so forth. In SIMOX, oxygen is implanted to form the silicon dioxide layer 62, and the upper layer 64 may be the original silicon surface or an epitaxial silicon surface grown after the ion implantation, for example.

The foregoing are merely illustrative examples, and more generally the first wafer 20 may employ any manufacturing process that provides the structure shown in FIG. 5 including a structural silicon substrate 60, an etch stop layer 62, and a crystalline silicon layer 64 of sufficient quality to serve as the base for epitaxial deposition of the FET logic layer 24.

Figure 6:
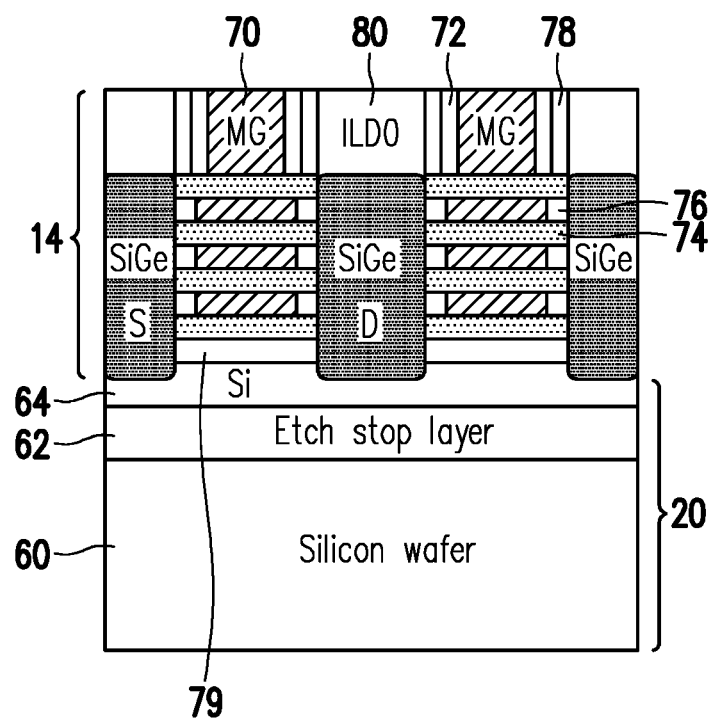
FIGS. 6 and 7 diagrammatically illustrate by way of diagrammatic cross-sectional view successive steps of manufacturing of the FET logic layer of a vertical architecture PCRAM.

With reference now to FIG. 6, an illustrative example of a heating FET 14 fabricated in accordance with FEOL processing 30 of FIG. 2 is shown by way of a diagrammatic cross-sectional view of an illustrative example. FIG. 6 shows the heating FET 14 fabricated on the first wafer 20, and more particularly on the epitaxial silicon layer 64 of the first wafer 20. The illustrative heating FET 14 is a gate-all-around (GAA) FET 14, which includes a gate 70, 72 including a gate metal 72 (also labeled as "MG"; note that the gate metal 70 can comprise other electrically conductive material besides a metal) with a high-K dielectric 72 (also referred to as a high-k dielectric 72), such as hafnium oxide ($HfO_2$) as a nonlimiting illustrative example, that wraps around a channel 74 (e.g., a silicon channel in one nonlimiting illustrative embodiment) of the GAA FET 14 to define the transistor structure. Spacers 76, 78, 79 which may for example comprise silicon nitride (SiN) and/or SiCN, and inter-layer dielectric (ILD) material 80 provide electrical isolation of various components. The illustrative SiN spacers 79 serve as an etch stop during the later wafer removal operation 38. The illustrative GAA FET 14 employs SiGe as the drain D and source S contacts. The fabrication of the GAA FET 14 uses suitable processing such as use of sacrificial layers, etch back techniques, and so forth to form the illustrative three-dimensional (3D) GAA FET 14.

While the illustrative example employs a GAA FET as the heating FET 14, this is merely an illustrative example. More generally the heating FET 14 could be a GAA FET with a different architecture, or another type of 3D FET such as a FinFET, or the heating FET 14 could be a planar FET. As the illustrative GAA FET 14 is merely one nonlimiting example of a suitable heating FET 14, only some of the reference numbers designating components of the example GAA FET are included in drawings subsequent to FIG. 6.

Figure 7:
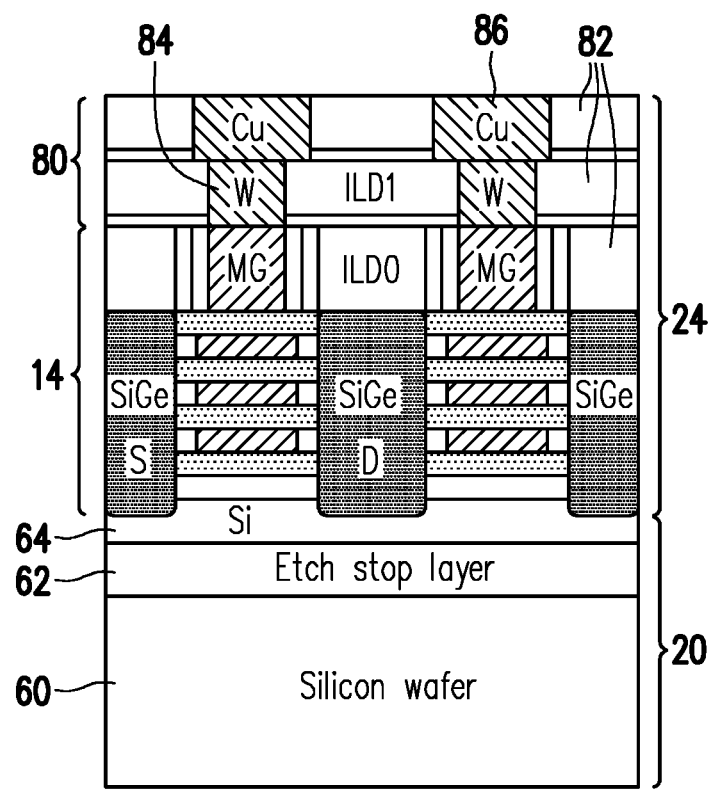

With reference now to FIG. 7, an illustrative example of MEOL processing 32 of FIG. 2 is shown by way of a diagrammatic cross-sectional view of an illustrative example. The MEOL processing provides a first metallization layer, referred to herein as M0 metal 80, providing electrical contact to the gate of the heating FET 14. The MEOL processing includes deposition of further layers of ILD material 82 providing support and electrical isolation for electrical vias 84 and the metal contracts and optionally traces 86. The vias 84 may for example comprise tungsten (W), while the metal contacts and traces 86 may comprise copper (Cu) or a copper alloy. These are merely nonlimiting illustrative examples. FIG. 7 shows only M0 metallization 80 making contact to the gate of the heating FET 14; however, the M0 metallization 80 may additionally include electrical interconnects (not shown) such as write line (WL) traces. As the electrical traces 86 serve as the write line to the heating FET 14 (i.e., as WL1 of FIG. 1), in some drawings the vias 84 are labeled as "WL1" (see, e.g. FIGS. 20-26). Electrical trace 86 is also indicated in the electrical schematic of FIG. 1.

It is also emphasized that FIG. 7 (and more generally FIGS. 6-22) are illustrating a single storage cell 10 of the PCRAM 1. Hence, the M0 metallization 80 for the PCRAM 1 extends over all storage cells 10 of the PCRAM 1 under fabrication, and may optionally include routing across rows or columns of storage cells of the WLs or other electrically conductive traces and/or so forth. The fabricated heating FETs 14 of all storage cells 10 of the PCRAM 1 and the M0 metallization 80 extending over the area of the PCRAM 1 under fabrication is sometimes collectively referred to herein as the FET logic layer 24 (see FIG. 1).

As previously noted, the FET logic layer fabrication of FIG. 2 operations 30 and 32 and FIGS. 6 and 7 typically includes some processing operations performed at relatively high temperature, e.g. a temperature of at least 700° C. in some embodiments, and at temperatures of 800-900° C. or higher in some embodiments. The subsequent operations 34, 36, 38, 40, 42, 44, 46, 48, 50 of FIG. 2 can typically be performed at lower temperature, e.g. a temperature of 500° C. or less in some embodiments, or 400° C. or less in some more restrictive embodiments, as higher temperatures can adversely impact the carrier wafer bonding and/or degrade components of the storage layer 26. Hence, the disclosed fabrication approach advantageously segregates the processing into high temperature FET logic layer fabrication followed by the lower temperature processes.

Figure 8:
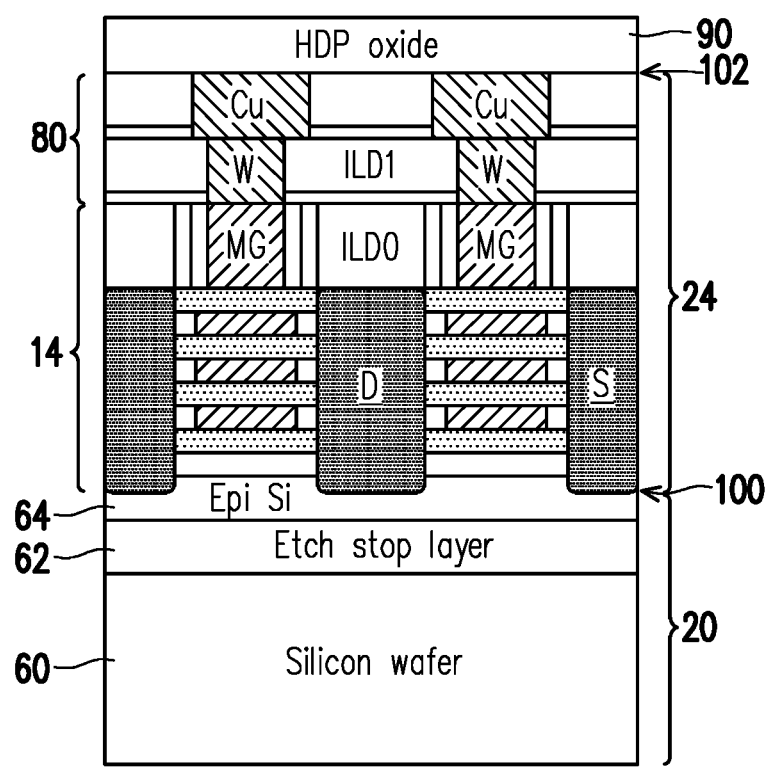
FIGS. 8, 9, and 10 diagrammatically illustrate by way of diagrammatic cross-sectional view successive steps of bonding the FET logic layer to a carrier wafer.
Figure 9:
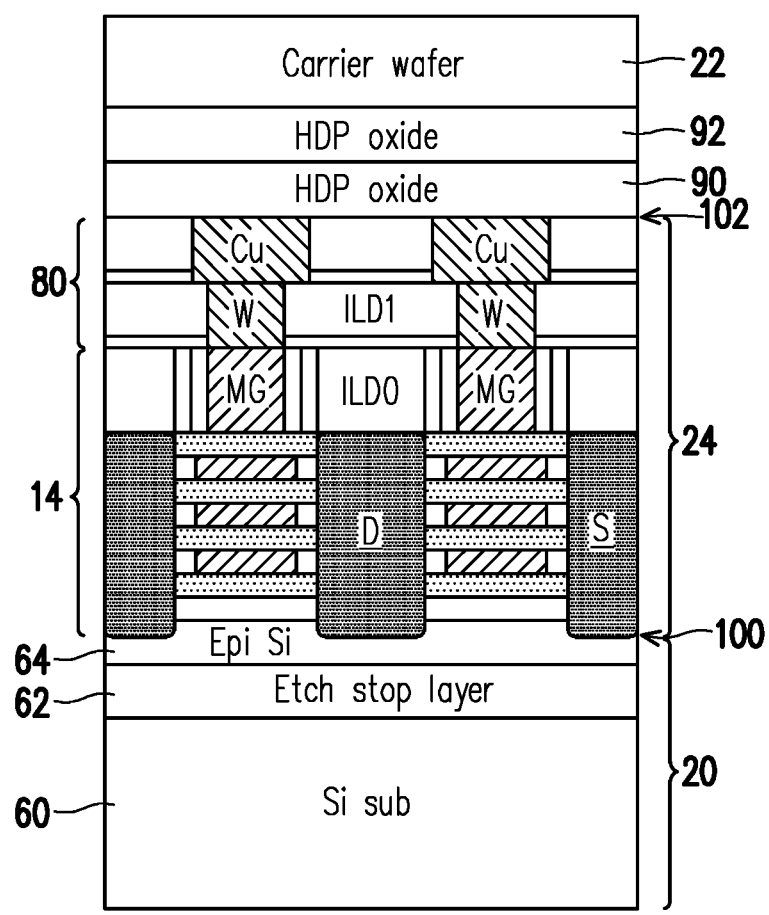
Figure 10:
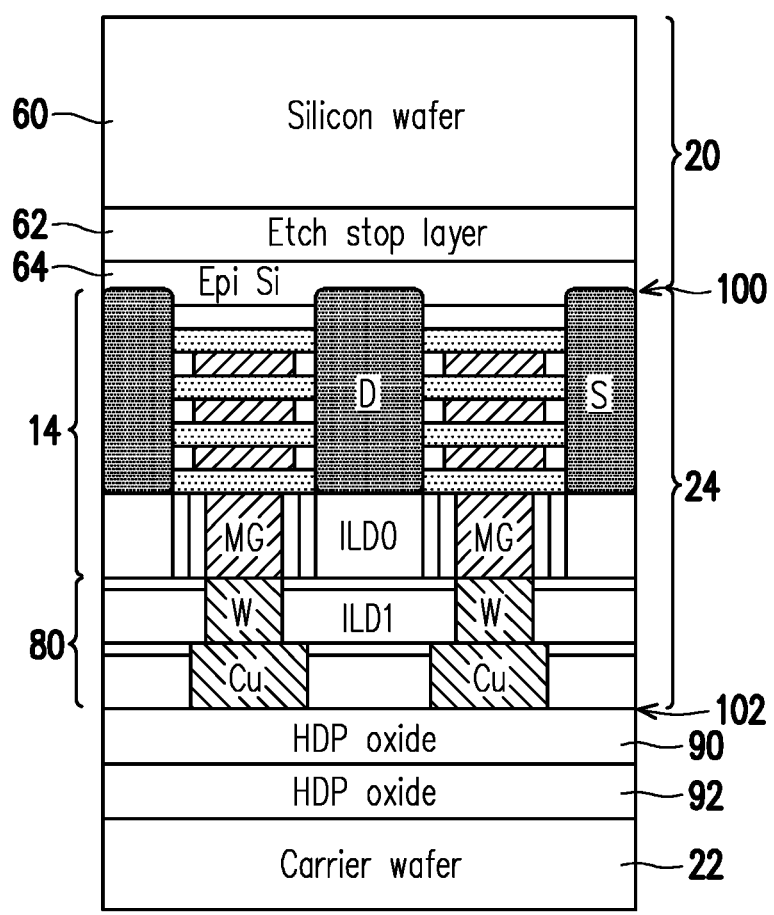

With reference now to FIGS. 8-10, an illustrative example of bonding of the carrier wafer 22 to the FET logic layer 24 as described in operations 34 and 36 of FIG. 2 is shown by way of a diagrammatic cross-sectional view of an illustrative example in FIGS. 8-10. FIG. 8 depicts the result of the high-density plasma (HDP) oxide deposition 34, which is a HDP oxide layer 90 formed on top of the FET logic layer 24 (depicted in FIG. 8 as the illustrative heating FET 14 and M0 metallization 80). Referencing FIG. 9, a HDP oxide 92 is similarly formed on the carrier wafer 22. The exposed surfaces of the respective HDP oxide layers 90 and 92 are planarized using chemical mechanical polishing (CMP). FIG. 9 shows the planarized HDP oxide layers 90, 92 bonded together to effectuate the bonding of the carrier wafer 22 to the FET logic layer 24. FIG. 10 shows the resulting structure flipped over. The bonding between the planarized contacting surfaces of the HDP oxide layers 90, 92 suitably occurs by fusion bonding promoted by a thermal anneal. Without being limited to any particular theory of operation, it is believed the fusion bonding occurs by way of –OH functional groups of the HDP plasma layers chemically bonding.

Described another way, a first surface 100 of the formed FET logic layer 24 is attached to the first wafer 60 by virtue of the FET logic layer 24 being fabricated on the first wafer 60 by epitaxy or other deposition techniques. (Note, the first surface is not an exposed surface during the FET logic layer fabrication, but rather corresponds to the interface between the forming FET logic and the underlying first wafer 20). A second surface 102 of the FET logic layer 24, which is opposite the first surface 100 of the FET logic layer, is bonded to the carrier wafer 22. The second surface 102 is exposed at the end of the fabrication of the FET logic layer 24, and more particularly the second surface 102 corresponds to the upper surface of the M0 metallization 80. After the wafer bonding (FIG. 9), the assembly is flipped over (FIG. 10) so that the first wafer 20 is now positioned on top for its subsequent removal in order to expose the first surface 100.

Figure 11:
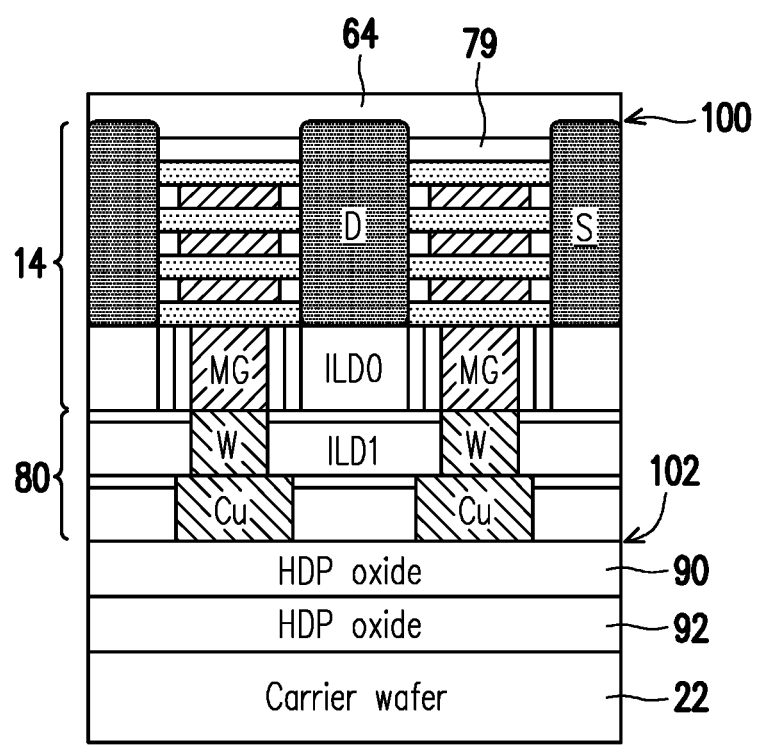
FIGS. 11-16 diagrammatically illustrate by way of diagrammatic cross-sectional view successive steps of manufacturing the storage layer of a vertical architecture PCRAM through formation of a metal plug that serves as the base for depositing a region of phase change material.
Figure 12:
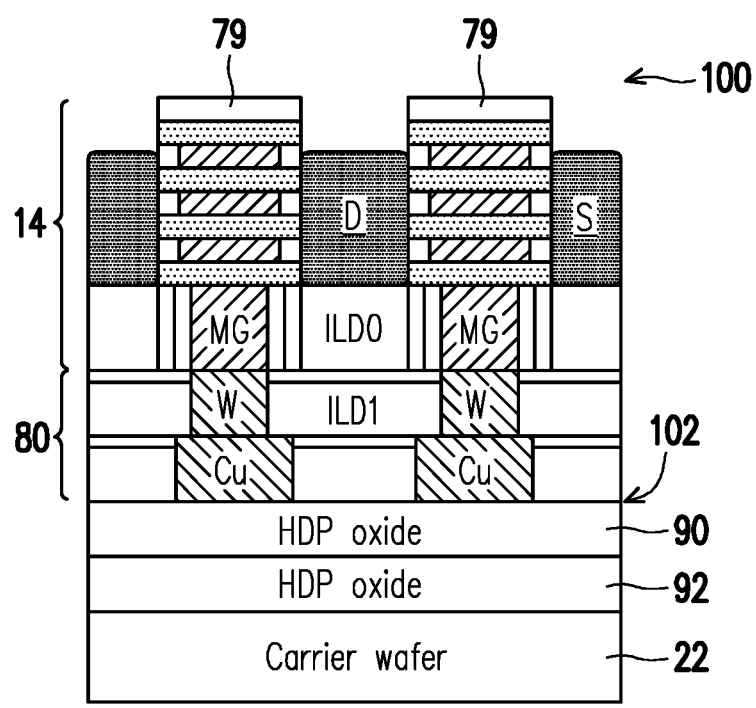

With reference now to FIGS. 11 and 12, an illustrative example of the wafer removal described in operation 38 of FIG. 2 is shown by way of a diagrammatic cross-sectional view of an illustrative example in FIGS. 11 and 12. FIG. 11 shows the device after removal of the silicon wafer 60 and the etch stop layer 62. In a suitable approach, most of the thickness of the silicon wafer 60 is removed by a fast process such as grinding, after which the remaining thinned silicon is removed by an etchant that has high selectivity for etching silicon over the material of the etch stop layer 62. After this, an etchant that has high selectivity for etching the material of the etch stop layer 62 over silicon is used to remove the etch stop layer 62, thus leaving only the epitaxial silicon 64 as shown in FIG. 11. Finally, an etchant that has high selectivity for etching silicon over the materials of the heating FET 14 deposited directly onto the silicon 64 (e.g., high selectivity over the SiGe of the source and drain contacts S and D and over the silicon nitride (SiN) and/or SiCN spacers 79 for the illustrative GAA FET 14). The resulting structure is shown in FIG. 12, where it is seen that the first surface 100 of the FET logic layer 24 is now exposed.

Figure 13:
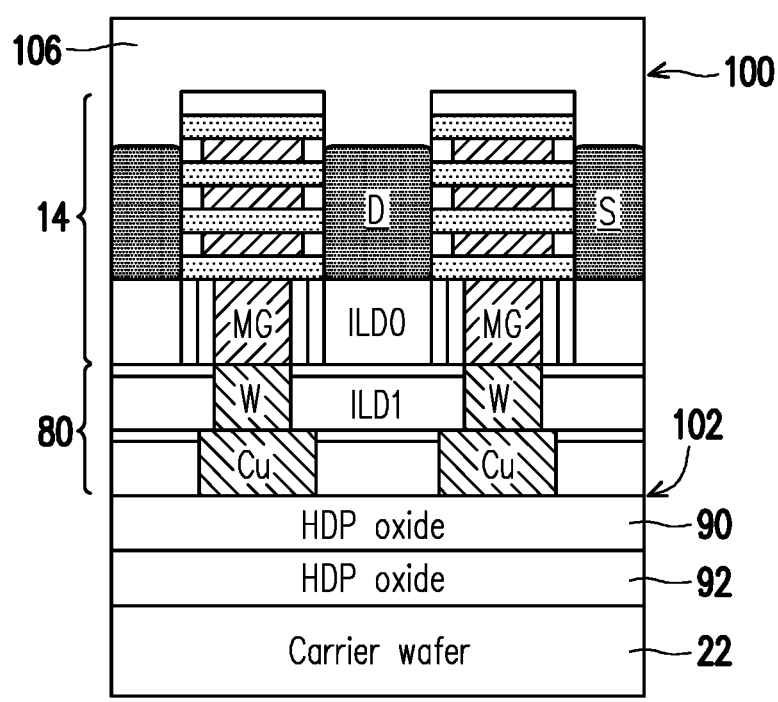

With reference now to FIG. 13, a dielectric isolation layer 106 formed in the dielectric isolation operation 40 of FIG. 2 is shown by way of a diagrammatic cross-sectional view. The dielectric isolation layer 106 can in general comprise any dielectric material. In some nonlimiting illustrative embodiments, the dielectric isolation layer 106 comprises silicon dioxide ($SiO_2$).

Figure 14:
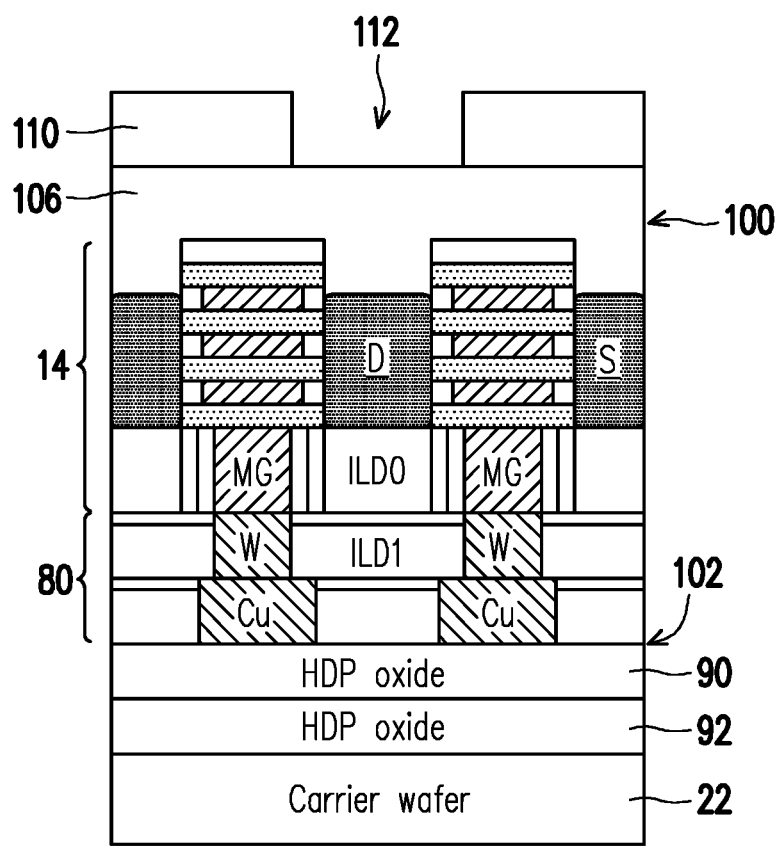
Figure 15:
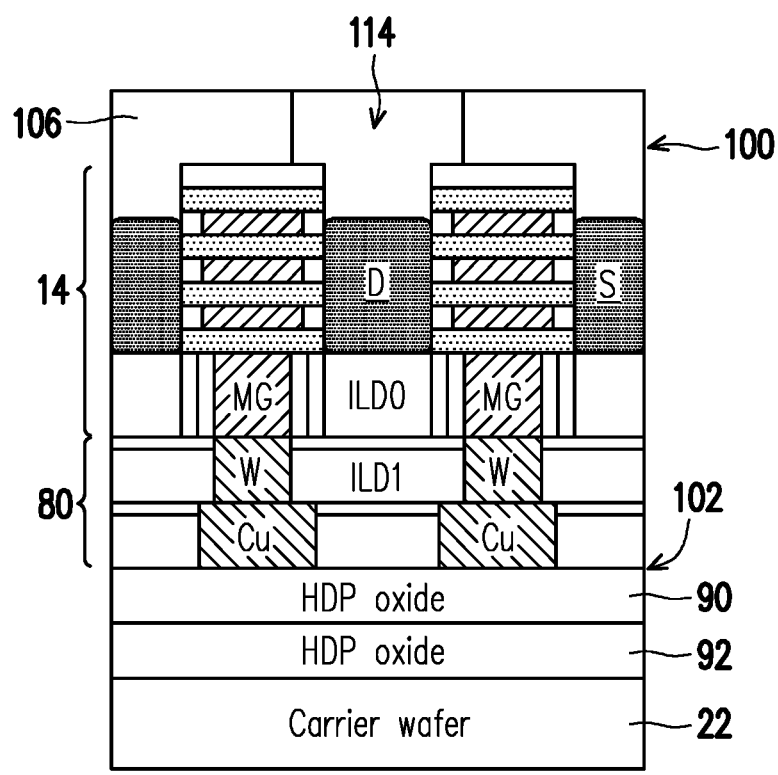
Figure 16:
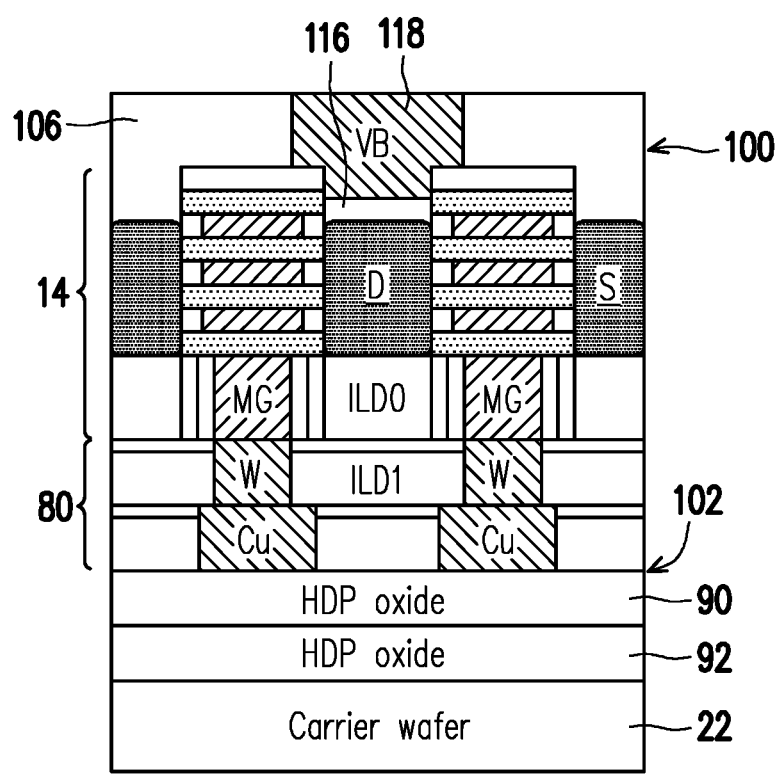

With reference now to FIGS. 14-16, an illustrative example of the contact patterning, dry etching, and contact silicide and contact plug formation operations 42 of FIG. 2 is shown by way of a diagrammatic cross-sectional view of an illustrative example in FIGS. 14-16. FIG. 14 illustrates patterned photoresist 110 formed on the dielectric isolation layer 106, e.g. formed by spin-on deposition of photoresist, light exposure through an appropriate photomask (not shown) and subsequent development to define an opening 112 of the patterned photoresist 110. The dielectric isolation 106 is then etched through the opening 112 to define an opening 114 in the dielectric isolation 106 and the patterned photoresist then stripped, to produce the structure as shown in FIG. 15. A contact silicide 116, such as $TiSi_x$, or a nickel- or cobalt- or platinum-based silicide for example, is deposited in the opening 114 followed by deposition of an electrically conductive plug 118, for example made of a low resistance metal such as tungsten, molybdenum, cobalt, ruthenium, iridium, or so forth. This produces the structure shown in FIG. 16. As seen in FIG. 16, the contact silicide 116 and electrically conductive contact plug 118 form an electrical contact to the drain D of the heating FET 14 (also indicated in FIG. 1). As will be subsequently described, the top of the electrically conductive plug 118 serves as the landing position for subsequent deposition of the region of phase change material 12 (see FIG. 20).

Figure 17:
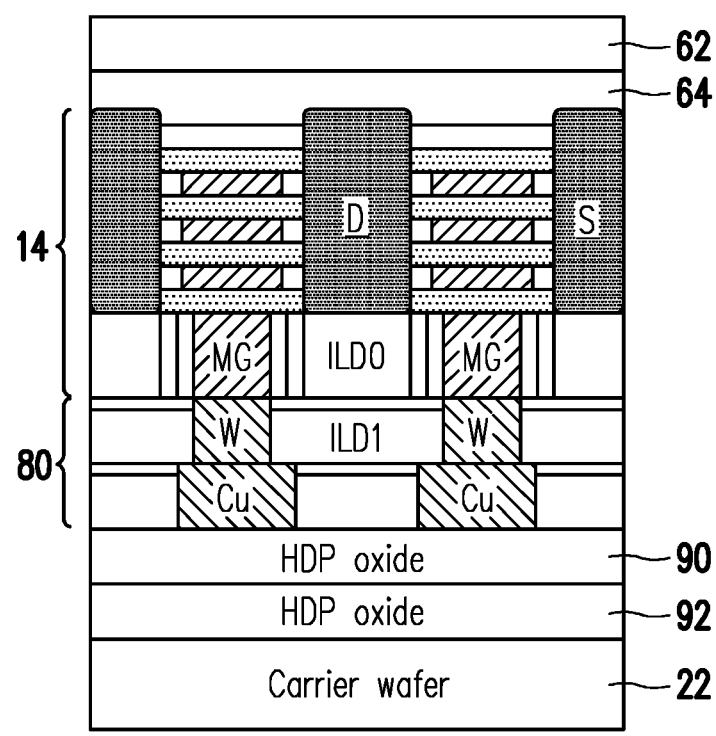
FIGS. 17-19 diagrammatically illustrate by way of diagrammatic cross-sectional view successive steps of an alternative method for forming the metal plug that serves as the base for depositing a region of phase change material.
Figure 18:
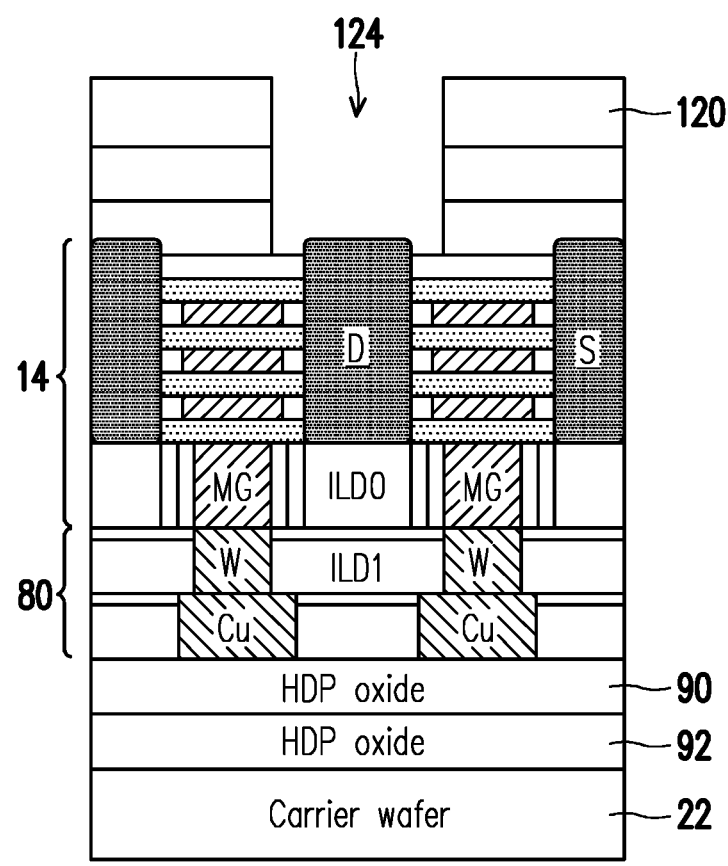
Figure 19:
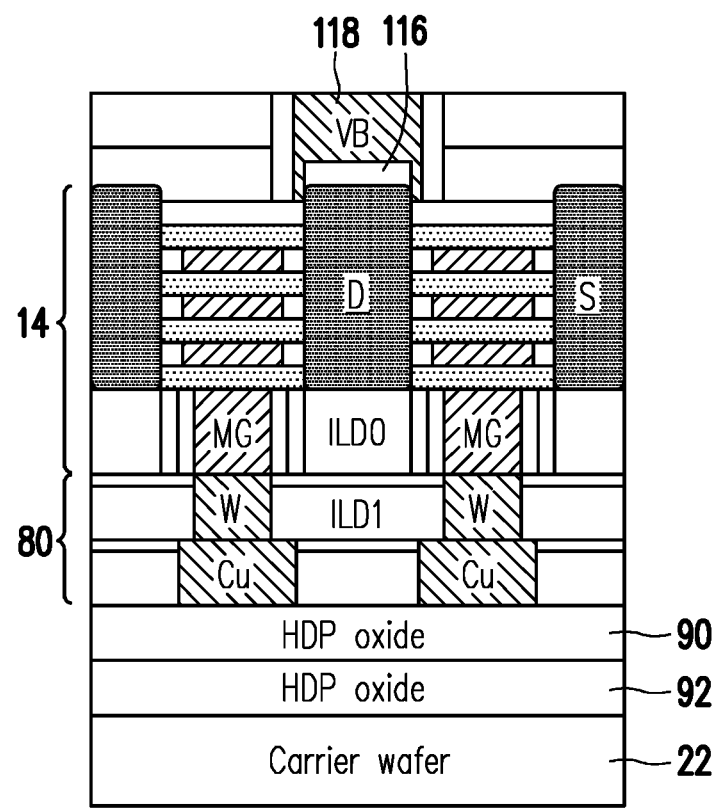

With reference to FIGS. 17-19, an alternative approach for forming the contact silicide 116 and electrically conductive plug 118 is shown by way of diagrammatic cross-sectional views. In this approach, starting with the device-under-fabrication as shown in FIG. 10, most of the thickness of the silicon wafer 60 is removed by a fast process such as grinding, after which the remaining thinned silicon is removed by an etchant that has high selectivity for etching silicon over the material of the etch stop layer 62. This leaves the etch stop layer 62 as the uppermost exposed surface, as shown in FIG. 17. Patterned photoresist 120 is then formed with an opening through which an opening 124 in the etch stop layer 62 and underlying epitaxial silicon 64 is etched, as shown in FIG. 18. The contact silicide 116 and electrically conductive plug 118 are then formed in the opening 124, thus producing the structure shown in FIG. 19.

Figure 20:
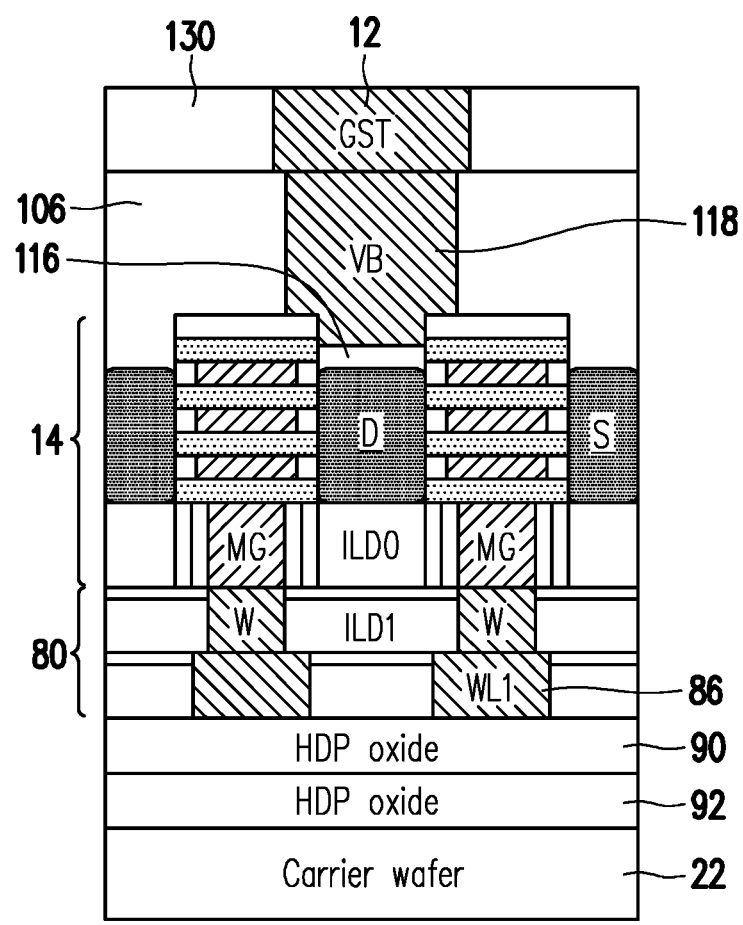
FIGS. 20-22 diagrammatically illustrate by way of diagrammatic cross-sectional view successive steps of manufacturing the storage layer of a vertical architecture PCRAM starting from depositing the phase change material on the metal plug (FIG. 20) through back end-of-line (BEOL) metal interconnect routing.
Figure 21:
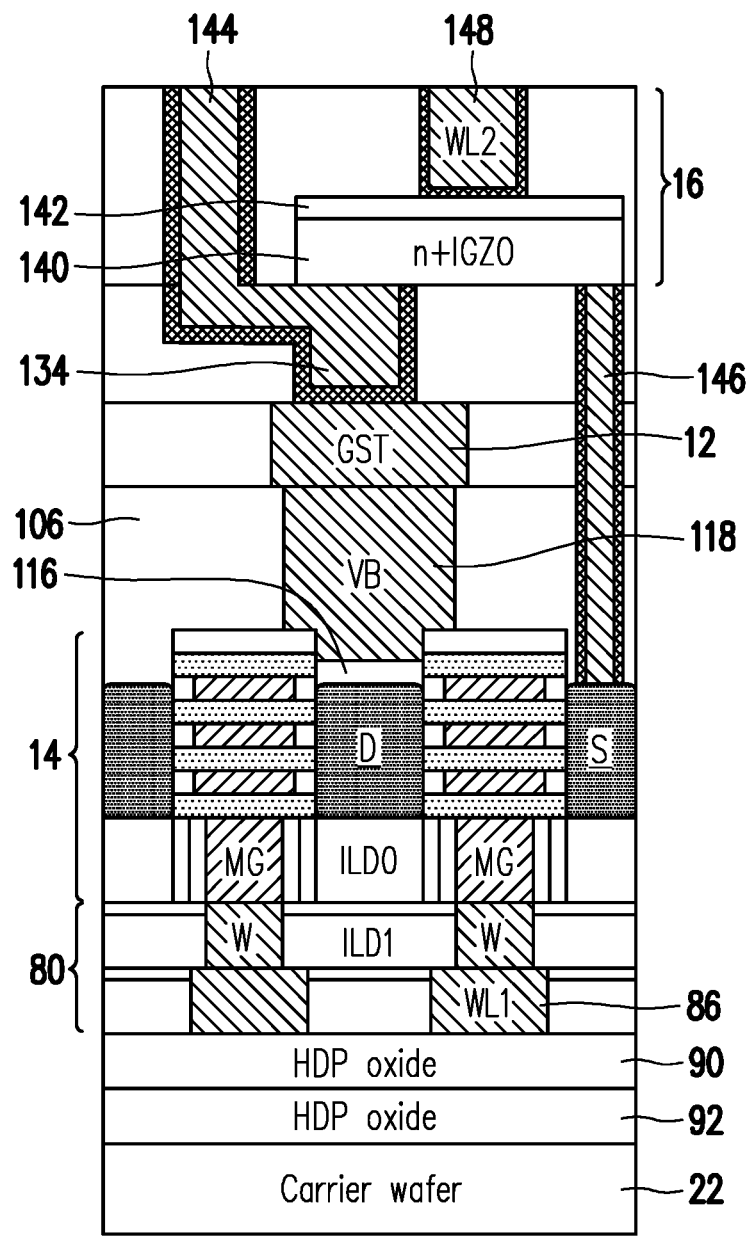

With reference to FIGS. 20 and 21, an illustrative example of the operation 46 of FIG. 2 in which the formation of the phase change material 12 and second heating transistor 16 is shown by way of diagrammatic cross-sectional views. This example of FIGS. 20-21 starts from the device-under-fabrication as shown in FIG. 16, but could analogously start with the device-under-fabrication as shown in FIG. 19. In either case, ILD material 130 is formed and patterned to define an opening accessing the top of the electrically conductive plug 118, and the region of phase change material 12 is deposited in this opening so as to contact the top of the electrically conductive plug 118. This produces the structure shown in FIG. 20. The electrically conductive plug 118 and contact silicide 116 thus forms the electrical connection between the region of phase change material 12 and the drain D of the heating FET 14. See also FIG. 1 showing this by way of electrical schematic. The illustrative phase change material 12 comprises a germanium antimony telluride (GST) composition. However, as previously discussed, other types of phase change material can be used, such as another chalcogenide material, e.g. a titanium antimony telluride (TST) composition. In one more specific nonlimiting illustrative embodiment, the phase change material 12 is a GST composition with the stoichiometry $Ge_2Sb_2Te_5$. The phase change material 12 is deposited at a relatively low temperature, e.g. at 500° C. or lower in some nonlimiting illustrative embodiments, or 400° C. or less in some more restrictive embodiments.

Thereafter, as seen in FIG. 21 the second heating transistor 16 is formed. To this end, further ILD material 132 is deposited to provide an insulating spacer, and is photolithographically patterned to form an opening within which a top electrode 134 is deposited which contacts the phase change material 12. Further IMD material deposition and patterning and electrically conductive material deposition is performed to form the second heating transistor 16 on the spacer ILD material 132, including a transistor channel 140, transistor gate 142 and electrical interconnects 144, 146, 148. As previously noted, the storage layer 26 (of which the second heating transistor 16 is a part) is advantageously formed at low temperature (see FIG. 1), e.g. at 500° C. or lower in some nonlimiting illustrative embodiments, or 400° C. or less in some more restrictive embodiments. Hence, the second heating transistor 16 is suitably made of materials and transistor architecture that can be fabricated at the desired low temperature, e.g. 500° C. or lower in the illustrative examples. To this end, the second heating transistor 16 is configured as a FET with the channel 140 comprising a thin film of an indium gallium zinc oxide (IGZO) composition, and the gate 142 comprises a high-K dielectric material such as hafnium oxide ($HfO_2$) as a nonlimiting illustrative example. In the illustrative example of FIG. 21, the top electrode 134 provides the electrical connection between the drain of the IGZO channel 140 of the second heating transistor 16 and the phase change material 12, and the electrical interconnect 144 forms the bit line of the PCRAM cell 10 (see also FIG. 1). The electrical interconnect 146 provides the electrical connection between the source of the IGZO channel 140 and the source S of the (first) heating FET 14 (see also FIG. 1). The electrical interconnect 148 contacts the gate 142 of the second heating transistor 16 and thus forms write line 2 (WL2; see also FIG. 1).

Figure 22:
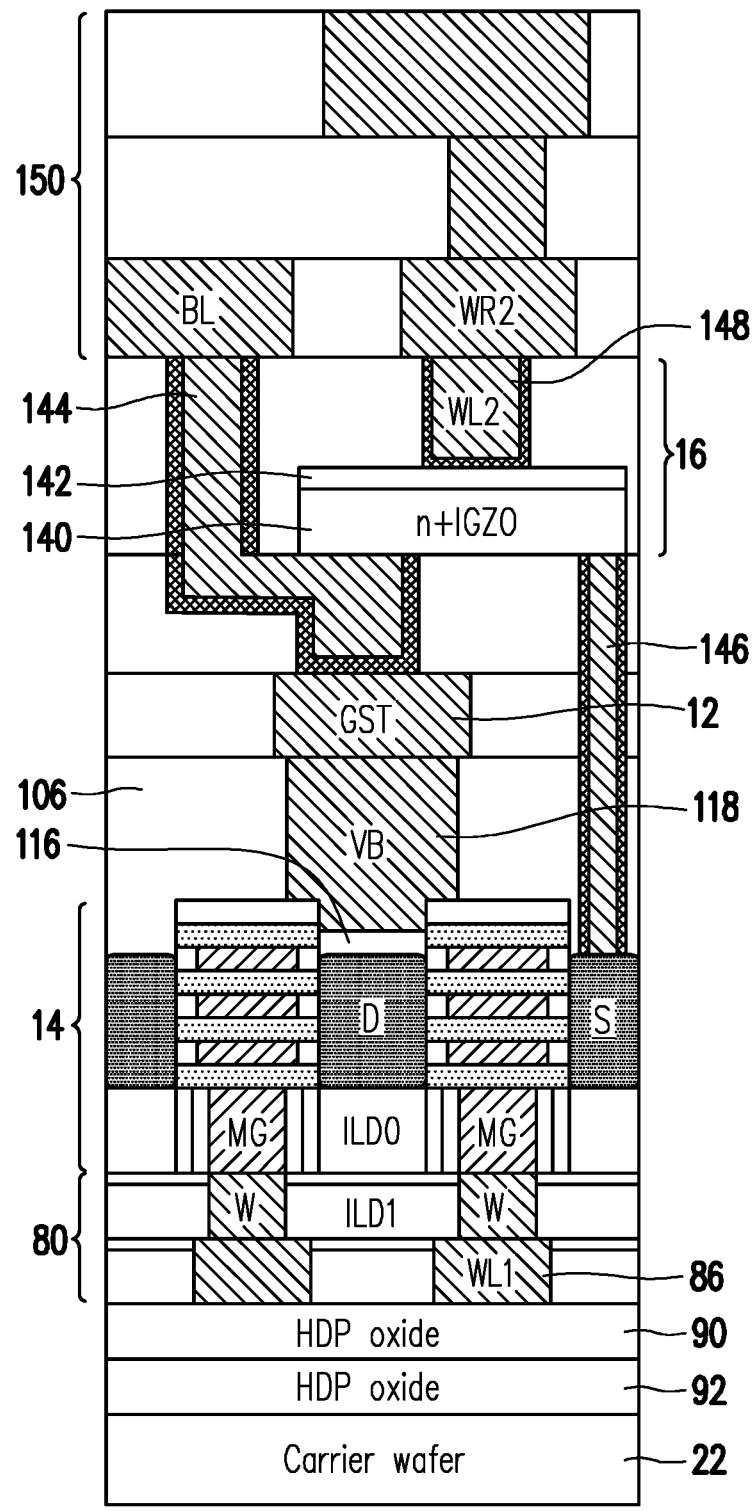

With reference to FIG. 22, an illustrative example of the BEOL processing 48 of FIG. 2 is shown by way of a diagrammatic cross-sectional view. The BEOL processing 48 forms one or more additional metals 150, e.g. a M1, M2, and et cetera, providing electrical routing to the bit line 144 and to WL2 148 in the overall PCRAM 1. Furthermore, the operation 50 of FIG. 2 may comprise further BEOL processing to provide electrical routing to WL1 86 by way of a through-oxide via (not shown).

It is to be understood that the examples described with reference to FIGS. 3-22 are nonlimiting illustrative examples, and numerous variations are contemplated. For example, the heating FET 14 may be variously constructed (e.g., GAA FET, FinFET, planar FET, et cetera). The second heating transistor 16 may be variously constructed, e.g. using a different channel material that can be fabricated at low temperature (e.g., 500° C. or lower in some embodiments, or 400° C. or less in some more restrictive embodiments). The detailed arrangement of the various electrical interconnects such as interconnects 86, 118, 134, 144, 146, 148 can be different from those illustrated. Furthermore, embodiments employing either an N-channel FET or a P-channel FET as the heating FET 14 are contemplated. In some embodiments, the top electrode 134 is shorter in height than the bottom electrode 118 embodied as the electrically conductive plug 118.

Figure 23:
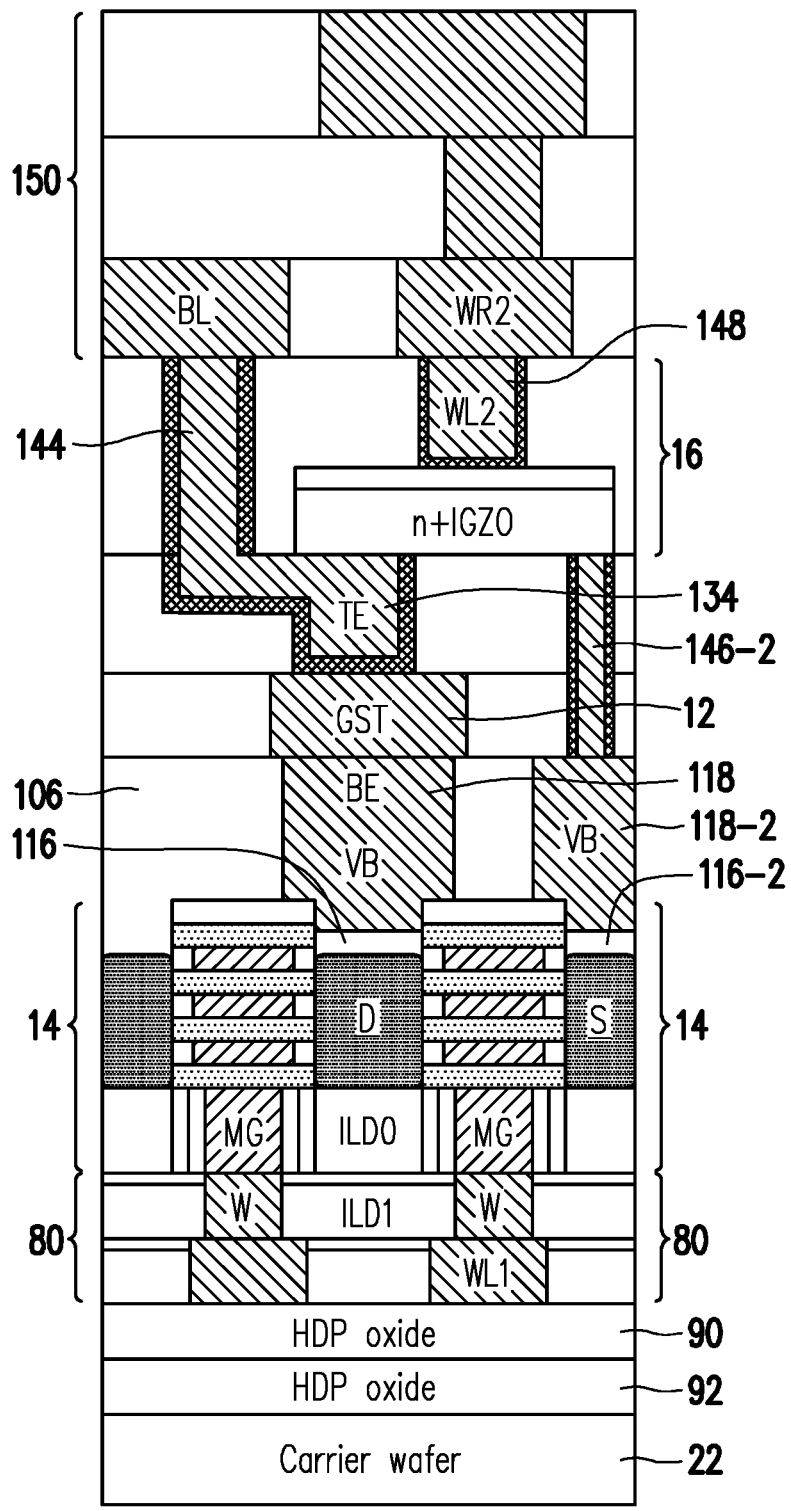
FIGS. 23-25 diagrammatically illustrate by way of diagrammatic cross-sectional additional embodiments of a vertical architecture PCRAM including a second heating FET.
Figure 24:
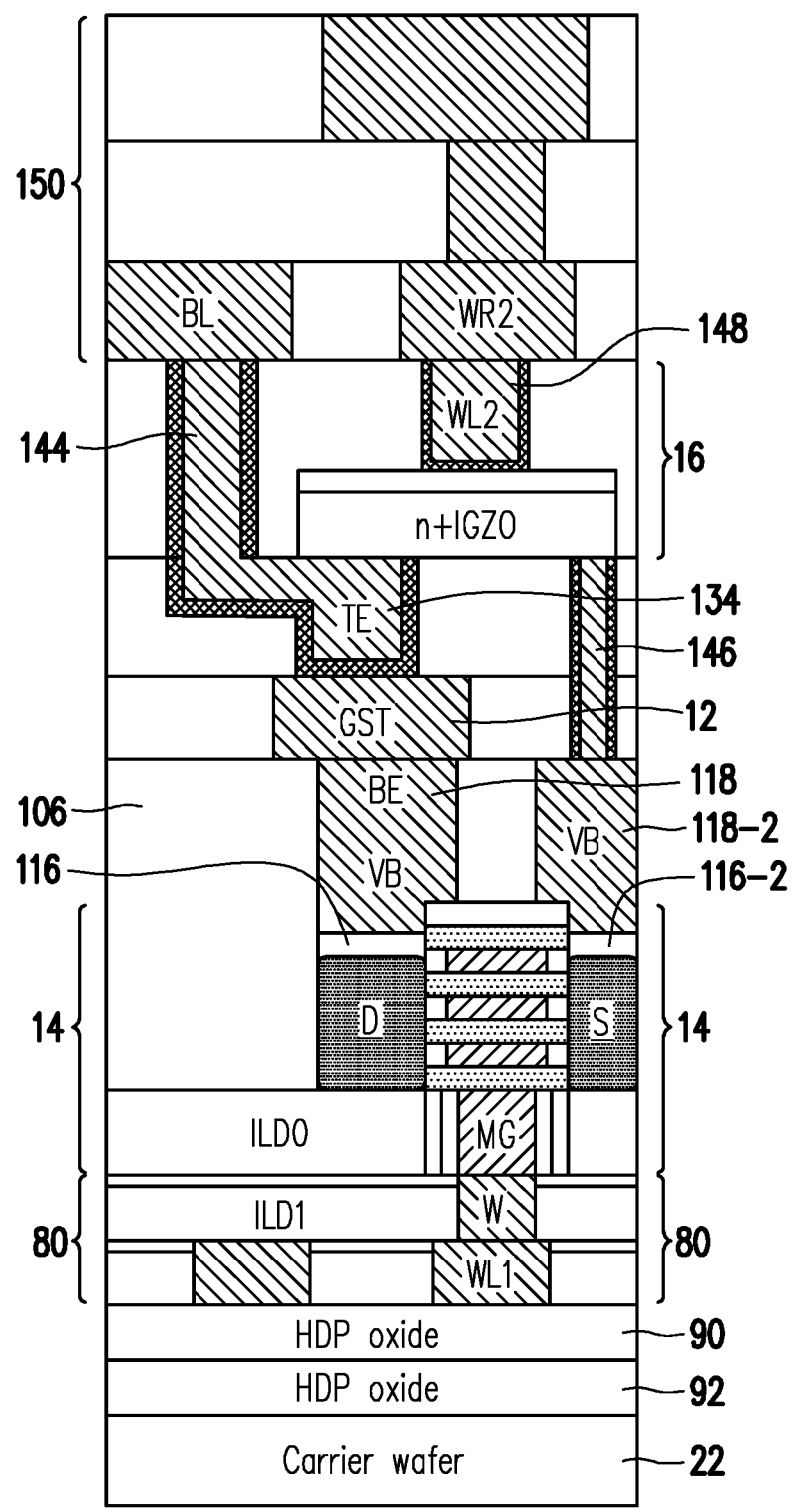
Figure 25:
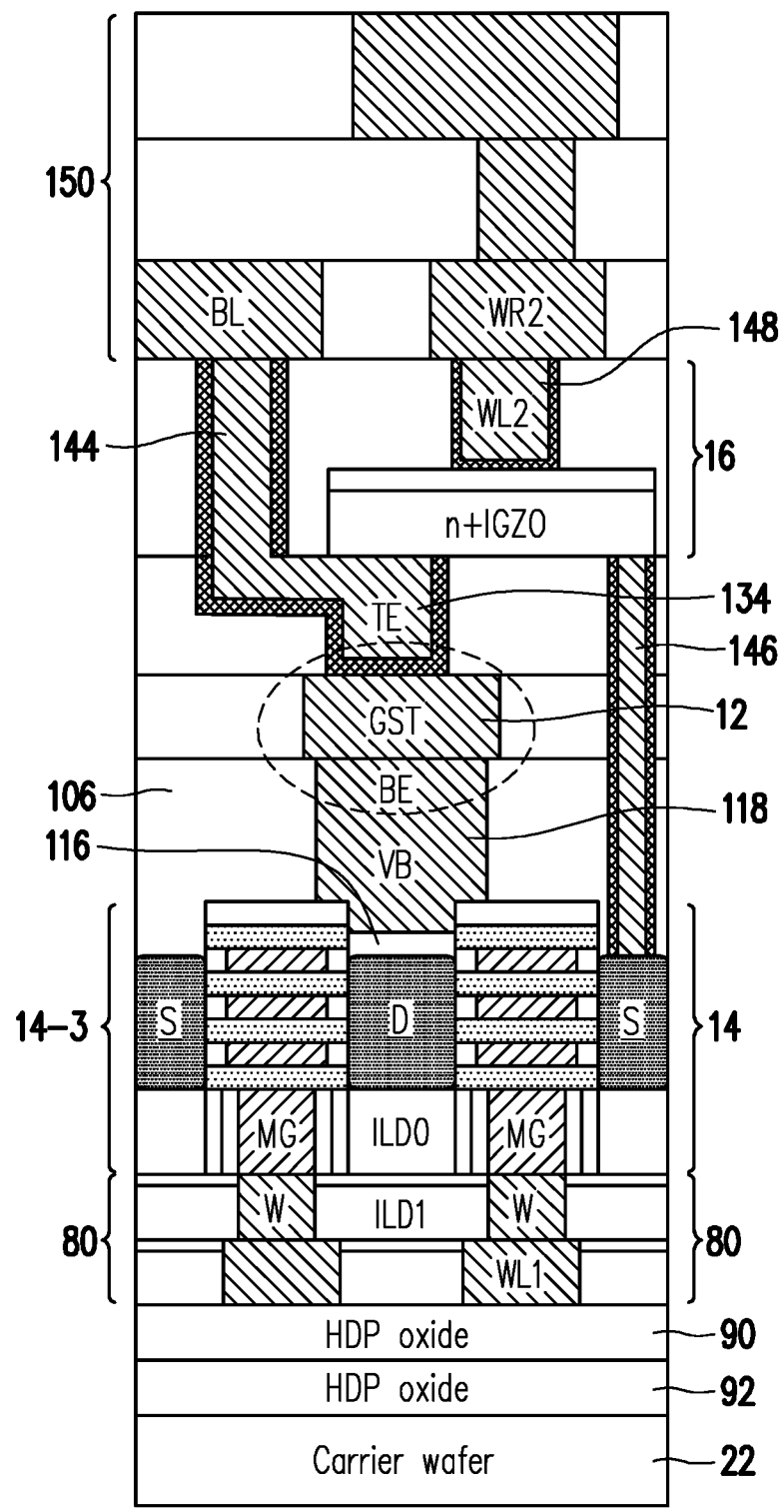

With reference to FIGS. 23-25, some variant embodiments are illustrated. In FIGS. 23-25, reference numbers corresponding to reference numbers of the embodiment of FIG. 22 denote the analogous features. The embodiment of FIG. 23 differs from that of FIG. 22 by providing a second electrical connection assembly including a second contact silicide 116-2 and a second electrically conductive plug 118-2 which are part of the FET logic layer 24 and are formed in the same way as the contact silicide 116 and electrically conductive plug 118, but contact the source S of the heating FET 14. An advantage of this approach is that the electrical interconnect 146 providing electrical connection between the source of the IGZO channel 140 and the source S of the heating FET 14 can be shortened to modified electrical interconnect 146-2 as shown in FIG. 23, which lands on the second electrically conductive plug 118-2. This eliminates the need to form a via passing into the FET logic layer 24 for the interconnect 146 during the formation of the storage layer 26.

The embodiment of FIG. 24 is similar to the embodiment of FIG. 23, but omits the left-hand GAA FET structure.

The embodiment of FIG. 25 is similar to the embodiment of FIG. 22, but includes the left-hand GAA FET structure and connects it to provide a second heating FET 14-3 for providing further heating of the phase change layer 12. Thus, the embodiment of FIG. 25 has three heating transistors 14, 14-3, and 16 connected to heat the phase change layer 12, enabling still further heating efficiency.

The foregoing embodiments of vertical architecture PCRAM also advantageously incorporate the second heating transistor 16 in the storage layer 26, in addition to the heating FET 14. As noted, this provides improved heating efficiency.

Figure 26:
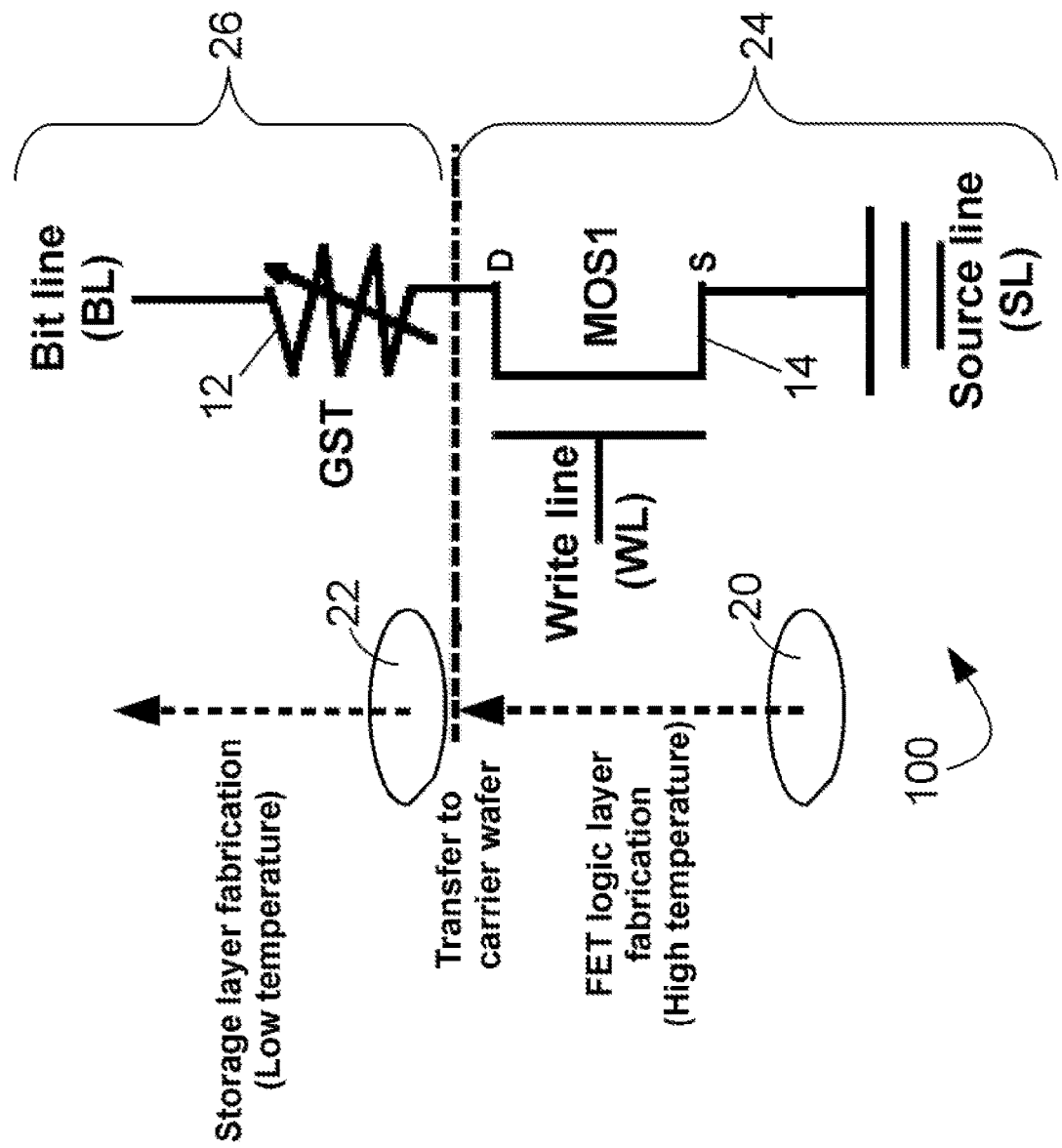
FIG. 26 diagrammatically illustrates a vertical architecture PCRAM cell not including a second heating FET, shown by way of diagrammatic equivalent circuit.

With reference to FIG. 26, however, if the additional heating efficiency provided by the second heating transistor 16 is not needed, then the second heating transistor 16 can be suitably omitted. FIG. 26 illustrates a vertical architecture PCRAM that is similar to that of FIG. 1, but omits the second heating transistor 16. In FIG. 26, reference numbers corresponding to reference numbers of the embodiment of FIG. 1 denote the analogous features. It will be appreciated that the vertical architecture of the embodiment of FIG. 26 retains the benefit of higher areal packing density due to the vertical arrangement of the phase change layer 12 and the heating FET 14.

In the following, some further embodiments are described.

In a nonlimiting illustrative embodiment, a method of fabricating a PCRAM is disclosed. The method includes forming a FET logic layer of the PCRAM on a first wafer, including forming at least one heating FET for each storage cell of the PCRAM. A first surface of the formed FET logic layer is attached to the first wafer. A second surface of the FET logic layer, which is opposite the first surface of the FET logic layer, is bonded to a carrier wafer. The first wafer is removed to expose the first surface of the FET logic layer with the second surface of the FET logic layer still bonded to the carrier wafer. After the removal of the first wafer, a storage layer of the PCRAM is formed on the exposed first surface of the FET logic layer, including forming a region of a phase change material for each storage cell that is electrically connected to a channel of the at least one heating FET of the storage cell.

In a nonlimiting illustrative embodiment, a method of fabricating a PCRAM is disclosed. The method includes forming a FET logic layer of the PCRAM on a first wafer, including forming at least one heating FET for each storage cell of the PCRAM. A first surface of the formed FET logic layer is attached to the first wafer. A second surface of the FET logic layer, which is opposite the first surface of the FET logic layer, is bonded to a carrier wafer. The first wafer is removed to expose the first surface of the FET logic layer with the second surface of the FET logic layer still bonded to the carrier wafer. After the removal of the first wafer, a storage layer of the PCRAM is formed on the exposed first surface of the FET logic layer, including forming a region of a phase change material for each storage cell that is electrically connected to a channel of the at least one heating FET of the storage cell. The forming of the storage layer of the PCRAM on the exposed first surface of the FET logic layer further includes forming a second heating transistor for each storage cell that is electrically connected to a channel of the second heating transistor.

In a nonlimiting illustrative embodiment, a PCRAM includes: a wafer; a FET logic layer disposed on the wafer and including at least one heating FET for each storage cell of the PCRAM; and a storage layer disposed on the FET logic layer. The storage layer includes a region of a phase change material for each storage cell that is electrically connected to a channel of the at least one heating FET of the storage cell.

In a nonlimiting illustrative embodiment, a PCRAM includes: a wafer; a FET logic layer disposed on the wafer and including at least one heating FET for each storage cell of the PCRAM; and a storage layer disposed on the FET logic layer. The storage layer includes: a region of a phase change material for each storage cell that is electrically connected to a channel of the at least one heating FET of the storage cell; and a second heating transistor for each storage cell that includes a channel electrically connected to the phase change material of the storage cell.

In a nonlimiting illustrative embodiment, a PCRAM includes: a wafer; a storage layer including a region of a chalcogenide material for each storage cell of the PCRAM; and a FET logic layer interposed between the wafer and the storage layer and including at least one heating FET for each storage cell that is electrically connected to heat the chalcogenide material of the storage cell.

In a nonlimiting illustrative embodiment, a PCRAM includes: a wafer; a storage layer including a region of a chalcogenide material for each storage cell of the PCRAM; and a FET logic layer interposed between the wafer and the storage layer and including at least one heating FET for each storage cell that is electrically connected to heat the chalcogenide material of the storage cell. The storage layer further includes a second heating transistor for each storage cell that is electrically connected to heat the chalcogenide material of the storage cell.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a phase change random access memory (PCRAM), the method comprising:
   forming a field effect transistor (FET) logic layer of the PCRAM on a first wafer including forming at least one heating FET for each storage cell of the PCRAM wherein a first surface of the formed FET logic layer is attached to the first wafer;
   bonding a second surface of the FET logic layer which is opposite the first surface of the FET logic layer to a carrier wafer;
   removing the first wafer to expose the first surface of the FET logic layer with the second surface of the FET logic layer still bonded to the carrier wafer; and
   after the removal of the first wafer, forming a storage layer of the PCRAM on the exposed first surface of the FET logic layer including forming a region of a phase change material for each storage cell that is electrically connected to a channel of the at least one heating FET of the storage cell.

2. The method of claim 1 wherein the forming of the storage layer of the PCRAM on the exposed first surface of the FET logic layer further includes:
   forming a second heating transistor for each storage cell that is electrically connected to a channel of the second heating transistor.

3. The method of claim 2 wherein the region of the phase change material and the second heating transistor are formed at a temperature of 500° C. or less.

4. The method of claim 3 wherein the forming of the FET logic layer includes performing at least one process operation at a temperature of at least 700° C.

5. The method of claim 2 wherein the forming of the second heating transistor includes depositing a channel of the second heating transistor comprising an indium gallium zinc oxide composition.

6. The method of claim 1 wherein the at least one heating FET is a finFET or a gate-all-around (GAA) FET.

7. The method of claim 6 wherein the removal of the first wafer to expose the first surface of the FET logic layer includes exposing the at least one heating FET of each storage cell, and the forming of the storage layer includes:
   forming a silicide layer on a drain of the channel of the finFET or GAA FET;
   forming an electrical via comprising a metal or metal alloy on the silicide layer; and
   forming the region of the phase change material on the electrical via.

8. The method of claim 1 wherein the bonding of the second surface of the FET logic layer to the carrier wafer includes:
   disposing an oxide layer on the second surface of the FET logic layer;
   performing chemical mechanical polishing (CMP) of the oxide layer disposed on the second surface of the FET logic layer; and
   after the CMP, bonding the oxide layer disposed on the second surface of the FET logic layer to an oxide layer disposed on the carrier wafer.

9. The method of claim 1 wherein the first wafer comprises a silicon wafer on which is disposed an etch stop layer on which is disposed an epitaxial silicon layer, wherein the FET logic layer is formed on the epitaxial silicon layer and the removing of the first wafer includes:
   removing the silicon wafer including etching at least a portion of the silicon wafer using the etch stop layer as an etch stop.

10. The method of claim 9 wherein the etch stop layer comprises a silicon germanium (SiGe) layer or an oxide layer.

11. The method of claim 1 wherein the phase change material comprises a chalcogenide material.

12. The method of claim 1 wherein the region of the phase change material of each storage cell is electrically connected to be heated by a channel electric current flowing between a source and drain of the at least one heating FET of the storage cell.

13. A method of fabricating a phase change random access memory (PCRAM), the method comprising:
   forming a field effect transistor (FET) logic layer of the PCRAM on a first wafer wherein the FET logic layer includes at least one heating FET for each storage cell of the PCRAM;
   bonding the FET logic layer to a second wafer;
   removing the first wafer with the FET logic layer still bonded to the second wafer, wherein the removal of the first wafer exposes a surface of the FET logic layer including the at least one heating FET of each storage cell; and
   after the transferring bonding, forming a storage layer on the exposed surface of the FET logic layer, the storage layer including a region of a phase change material for each storage cell that is electrically connected to a channel of the at least one heating FET of the storage cell.

14. The method of claim 13 wherein the storage layer further includes:
   a second heating transistor for each storage cell that includes a channel electrically connected to the phase change material of the storage cell.

15. The method of claim 14 wherein the second heating transistor includes a channel comprising an indium gallium zinc oxide composition.

16. The method of claim 13 wherein the at least one heating FET is a finFET or a gate-all-around (GAA) FET.

17. The method of claim 13 wherein the phase change material comprises a chalcogenide material.

18. The method of claim 17 wherein the phase change material comprises a germanium antimony telluride (GST) or titanium antimony telluride (TST) composition.

19. A method of fabricating a phase change random access memory (PCRAM), the method comprising:
   forming a field effect transistor (FET) logic layer of the PCRAM on a first wafer including forming at least one heating FET for each storage cell of the PCRAM wherein a first surface of the formed FET logic layer is attached to the first wafer;
   transferring the FET logic layer from the first wafer to a second wafer; and
   after the transferring, forming a storage layer of the PCRAM on the FET logic layer including forming a region of a chalcogenide phase change material for each storage cell that is electrically connected to be heated by a channel electric current flowing between a source and drain of the at least one heating FET of the storage cell, wherein the storage layer is formed at a temperature of 500° C. or less.

20. The method of claim 19 wherein the forming of the storage layer includes:
- forming a silicide layer on a drain of the channel of the finFET or GAA FET;
- forming an electrical via comprising a metal or metal alloy on the silicide layer; and
- forming the region of the chalcogenide phase change material on the electrical via.

* * * * *